United States Patent [19]

Chan et al.

[11] Patent Number: 4,550,871
[45] Date of Patent: Nov. 5, 1985

[54] FOUR-MOTION WIRE BONDER

[75] Inventors: Lo K. Chan; Yui K. Tang; Jui Chang, all of Hong Kong, Hong Kong

[73] Assignee: ASM Assembly Automation Ltd., Hong Kong, Hong Kong

[21] Appl. No.: 410,943

[22] Filed: Aug. 24, 1982

[51] Int. Cl.[4] .................... B23K 37/02; H01L 21/607
[52] U.S. Cl. .................................... 228/4.5; 228/6.2; 228/180.2
[58] Field of Search ................................ 228/1, 4–5, 228/6 A, 5.1, 179, 180 A, 27; 29/739, 740, 850; 219/56.1, 56.21

[56] References Cited

U.S. PATENT DOCUMENTS

| 3,515,844 | 6/1970 | Colarossi et al. | 228/37 |
| 3,960,309 | 6/1976 | Hazel | 228/5.1 |
| 4,031,612 | 6/1977 | Nicolas | 29/850 |
| 4,053,096 | 10/1977 | Heim | 228/180 A X |
| 4,188,525 | 2/1980 | Merrick et al. | 228/27 |
| 4,361,261 | 11/1982 | Elles et al. | 228/179 |

FOREIGN PATENT DOCUMENTS

| 1283515 | 7/1972 | United Kingdom . |
| 2004222 | 3/1979 | United Kingdom . |
| 2063134 | 6/1981 | United Kingdom . |

*Primary Examiner*—Kenneth J. Ramsey
*Assistant Examiner*—M. Jordan
*Attorney, Agent, or Firm*—Weiss & Holloway

[57] ABSTRACT

A four-motion wire bonding apparatus, for effecting wire bonds between a semiconductor chip and a lead frame. In addition to employing X-, Y-, Z- and theta-motion drives for the bonding head, the apparatus provides a bulk wire-feed, which delivers bonding wire along the theta-rotation axis.

4 Claims, 4 Drawing Figures

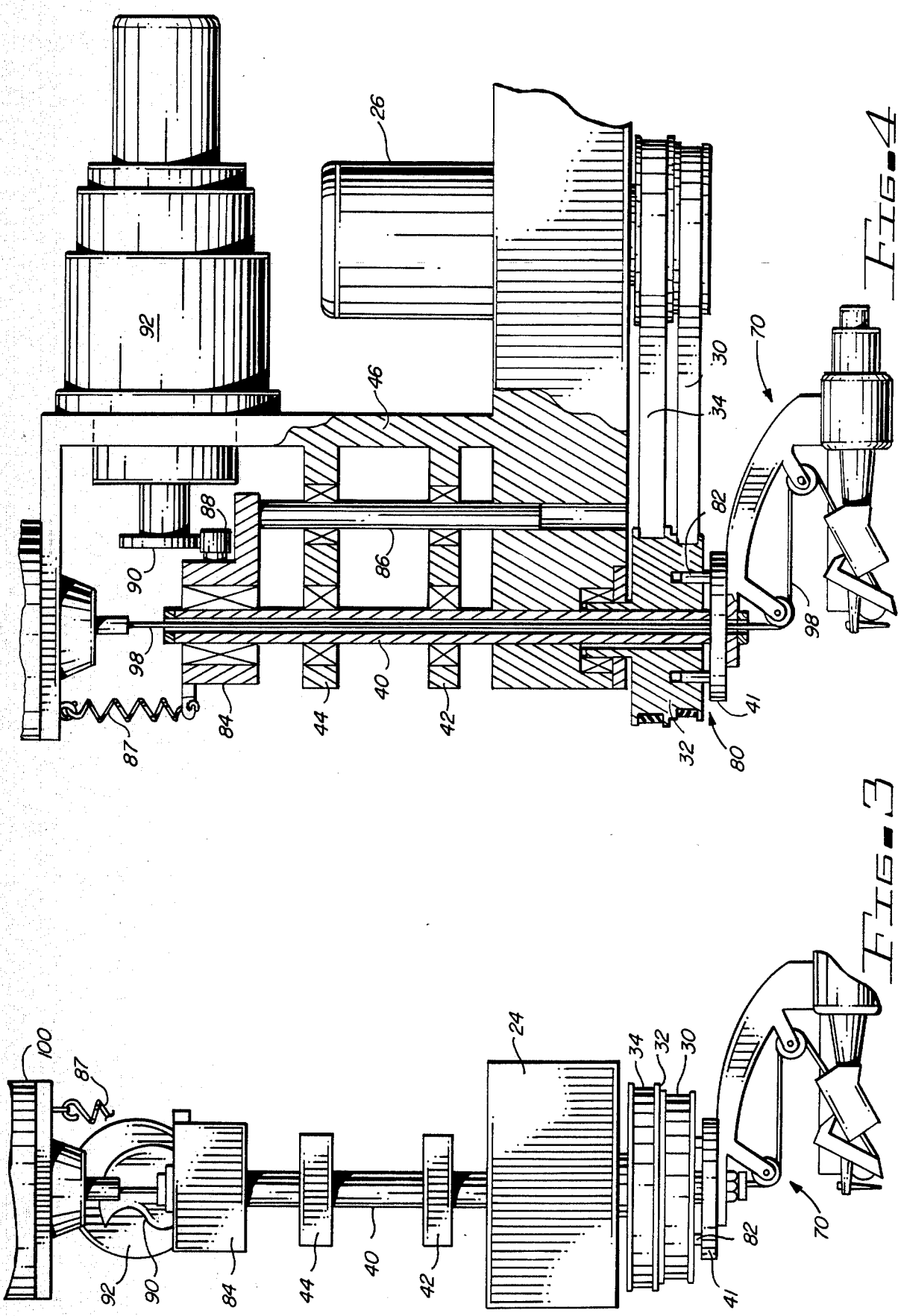

FOUR-MOTION WIRE BONDER

DESCRIPTION OF THE INVENTION

1. Field of the Invention

This invention relates to semiconductor manufacturing equipment, and, more specifically, relates to a universal wire-bonding device which permits a wire to be bonded to a fixed bonding site at any elevation, at any lateral or longitudinal position, and in any angular orientation. A further aspect of the invention relates to a wire-feeding apparatus for delivering wire along the axis of rotation of the shaft supporting the bonding head of the aforementioned wire-bonding device.

2. Description of the Prior Art.

In the past, semiconductor manufacturing has been widely developed. Despite the developments of the past, a need continued to exist for a wire-bonding device which could effect the two bonds required to connect a wire between a semiconductor chip and a lead frame, with the respective bonds being located as desired, at any elevation, at any lateral and longitudinal location, and in any angular orientation with respect to one another.

Typically, wire-bonding devices of the past had mounted a small spool of wire on the bonding head itself. A desire to minimize the rotational inertia of the bonding head, and the close quarters in which the bonding head operated, combined to severly limit the permissible size of the wire spool which could be mounted on the bonding head. A further need existed for a bulk wire-feed apparatus for a semiconductor wire bonding apparatus, which would reduce or obviate the need for frequent operator attention to replace an empty spool.

BRIEF DESCRIPTION OF THE DRAWING

FIG. 3 is an enlarged frontal elevational view of the 4-motion drive and bonding head of the bonding apparatus of FIG. 1.

FIG. 4 is a partially sectional view taken in the direction of FIG. 2.

SUMMARY OF THE INVENTION

In accord with a broadest aspect of this invention, a single wire-bonding device capable of effecting succeeding wire bonds at respective bonding sites on a stationary surface is provided, which bonding sites may permissibly include differing elevations, differing lateral and longitudinal positions, and differing angular orientations.

A bulk wire-feed for a four-motion wire bonding apparatus is also provided which feeds the wire along the theta-rotation axis of the shaft supporting the bonding head.

The foregoing and other objects, features and advantages of this invention will be apparent from the following, more particular, description of the preferred embodiments of the invention as shown in the accompanying drawings.

DESCRIPTION OF THE PREFERRED EMBODIMENTS

Figure 1:
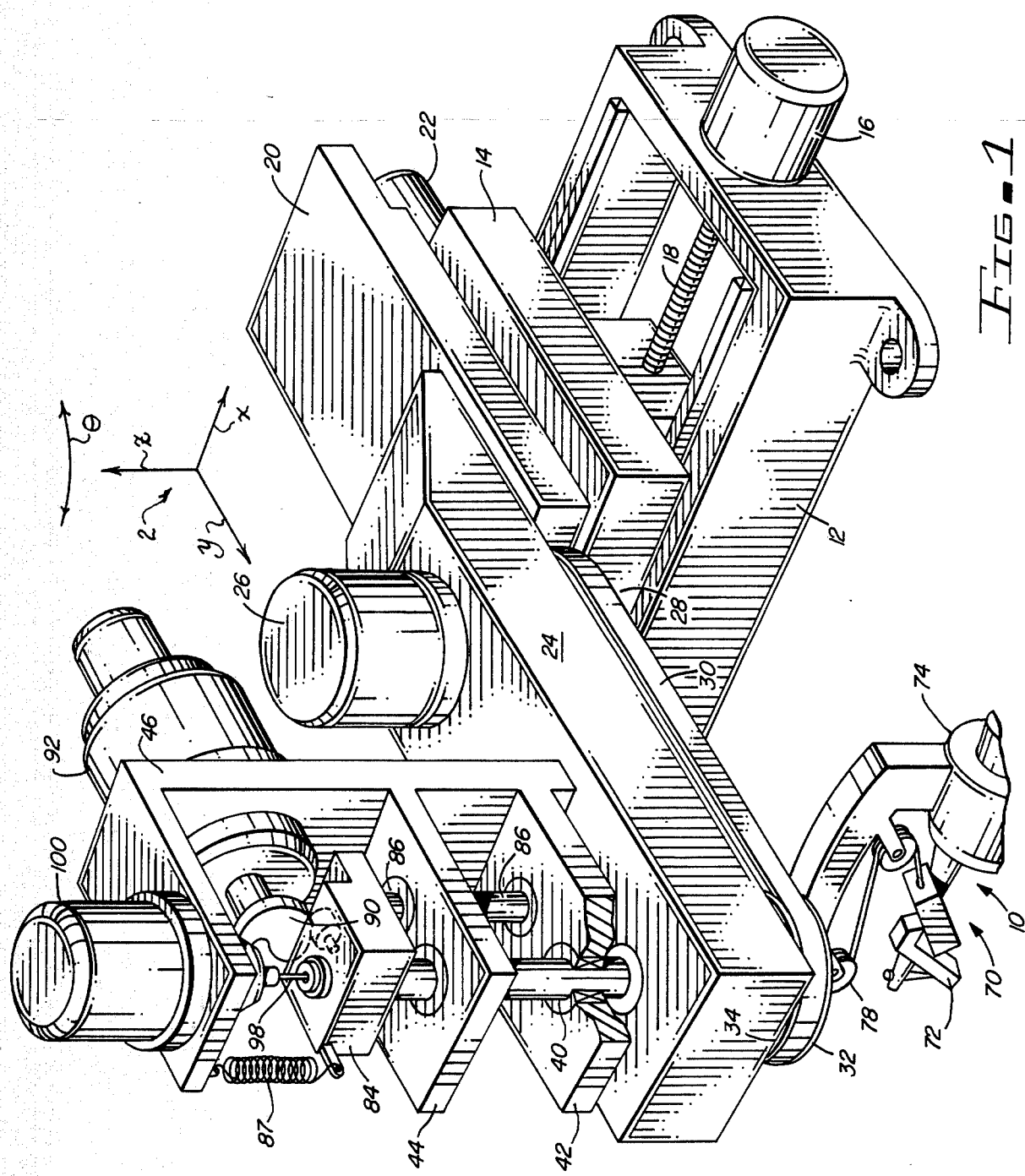
FIG. 1 is a perspective elevational view of the wire-bonding apparatus disclosed herein.

In FIG. 1, a frame or reference for the directional references herein is shown generally by reference number 2.

In FIG. 1, a general schematic view of the four-motion wire bonding apparatus is shown generally by reference number 10. A base 12 slidably supports an X-motion table 14 on linear slide-bearings. An X-drive motor 16 is mounted to the base 12, and moves the X-motion table 14 relative to the base 12 with an X-motion lead screw 18.

Similarly, a Y-motion table 20 is slidably mounted on linear slide-bearings atop the X-motion table 14. A Y-motion motor 22 is supported by the X-motion table 14, and laterally moves the Y-motion table relative to the X-motion table 14 through rotation of a connected Y-motion lead screw (not shown). A cantilevered sub-frame 24 is mounted atop the Y-motion table 20. A theta-motion motor 26 is rigidly mounted to the sub-frame 24. A drive pulley 28 is mounted upon the output shaft of the theta-motion motor 26, and is positioned generally below the overhang of the cantilevered sub-frame 24.

The drive pulley 28 drives a belt 30, which in turn rotates a driven pulley 32. The driven pulley 32 is coupled to the cantilevered sub-frame 24 near its outer limit, in rotational freedom but in a fixed axial position. Both the drive pulley 28 and the driven pulley 32 are also grooved to mount a flat cable 34, which is shown best in FIGS. 2 and 3. The flat cable 34 is a multi-conductor electrical cable, and carries the current to operate a bonding head, as shown generally by reference number 70, and which includes at least a wire clamp 72 and a transducer 74. With the exception of the idler sheaves 78, whose function is subsequently explained, the bonding head 70 is of conventional design.

Figure 2:
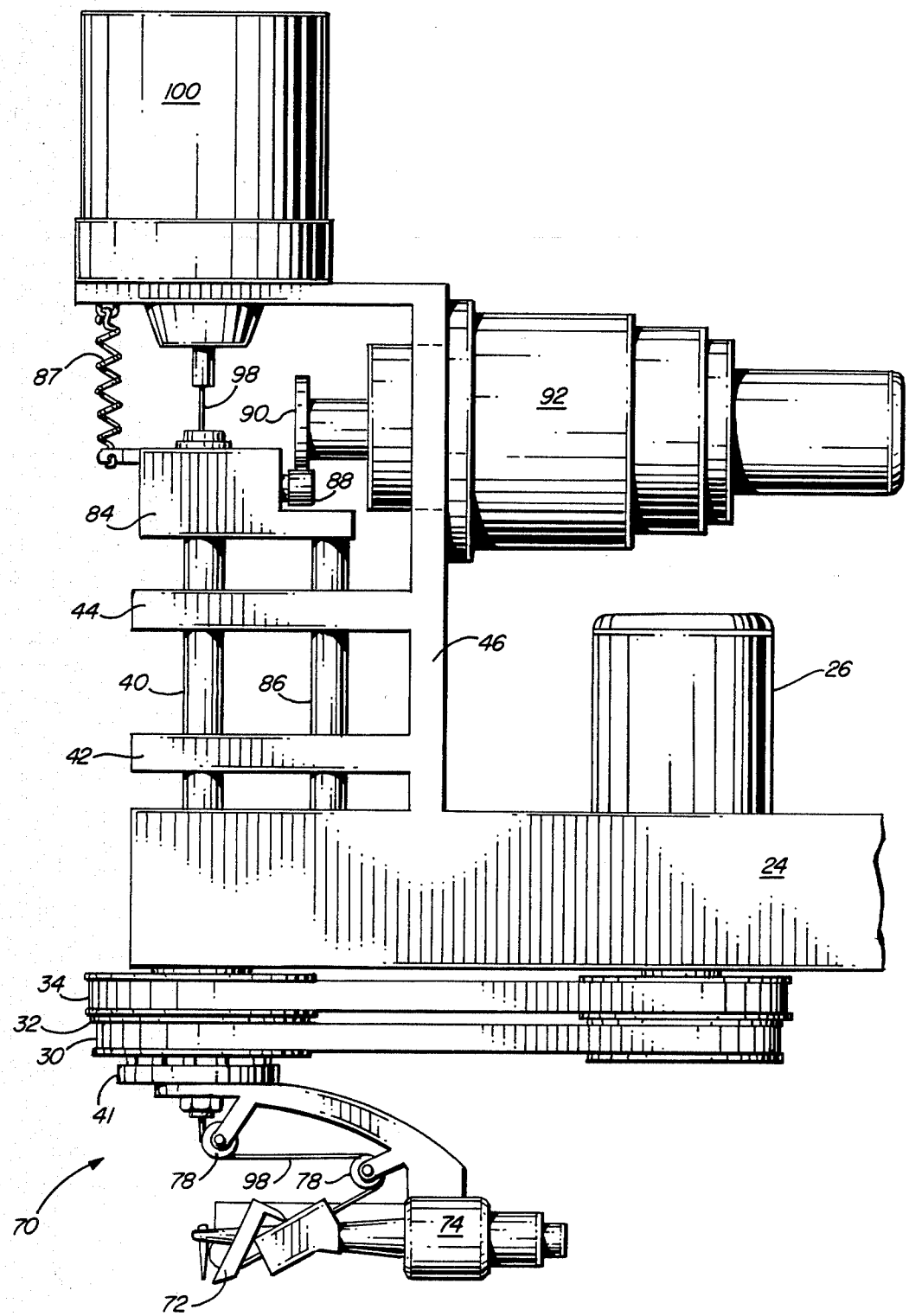
FIG. 2 is an enlarged side elevational view of the 4-motion drive and bonding head of the bonding apparatus of FIG. 1.

Referring then additionally to FIGS. 2, 3 and 4, and as best shown in FIG. 4, a theta-motion shaft 40 passes axially through the driven pulley 32. The lower end of the theta-motion shaft 40 defines a mount plate 41, which supports the bonding head 70. Lug means, as shown generally by reference number 80, keep the driven pulley 32 and the theta-motion shaft 40 in a fixed rotational relationship, while permitting the shaft 40 to float axially within the driven pulley 32. While the lug means 80 are shown as a series of studs 82 rigidly mounted to the mount plate 41, and floating in axial freedom in the driven pulley 32, the disclosure herein will suggest other connecting linkages to one skilled in the art.

The theta-motion shaft 40 extends upward, and is supported by arms 42, 44 of a support 46. The arms 42, 44 locate the shaft 40, while still permitting both rotary and axial movement.

An alignment collar 84 encircles the theta-motion shaft 40 near the upper limit thereof, and rigidly supports an alignment shaft 86 which passes through the arms 42, 44. The alignment collar 84 permits the theta-motion shaft 40 rotational freedom, but rests in a fixed longitudinal position with respect thereto. The alignment shaft 86 is free to axially move through the arms 42, 44, but retains a fixed rotational orientation with respect thereto. Return springs 87 urge the alignment collar 84, and the connected theta-motion shaft 40 and connected bonding head 70, toward the upper limit of travel of the shaft 40. The upper limit of travel for the shaft 40, and any downward displacement thereof, are both determined by a Z-motion cam 90. The Z-motion cam 90 is supported by the shaft of a Z-motion motor 92, which, in turn, is mounted upon the support 46. The cam 90 rests upon the alignment collar 84, which is preferably provided with a suitable cam follower 88 to reduce friction.

Mounted atop the support 46, in axial alignment with the theta-motion shaft 40, a wire spool 100 contains a reserve of bonding wire 98. As best shown in FIG. 4, the bonding wire 98 is fed axially down the length of the theta-motion shaft 40 to provide the ability to effect a large number of wire bonds without requiring operator service.

In use, the X-, Y-, Z- and theta-drives can be operated, in a manner which will be apparent from the disclosure herein to one versed in the art, to provide the position necessary to permit the bonding head 70 to effect the desired bonds.

Further, the wire spool 100, feeding the wire 98 axially down the length of the theta-drive shaft 40, and around one or more of the pulleys 78, will permit the clamp apparatus of the bonding head 70 to feed wire as may be required, while reducing necessary operator maintenance to a bare minimum.

Thus there is provided a device having clear advantage over those devices of the past.

While the invention has been particularly described and shown with reference to preferred embodiments thereof, it will be understood by those skilled in the art that the foregoing and other changes in form and details may be made therein without departing from the spirit and scope of the invention.

It is claimed that:

1. An apparatus for wire bonding supported on a base, comprising:
    a wire bonding head;
    X-motion means operably coupled to said wire bonding head for imparting X-directional movement to said wire bonding head, said X-motion means including an X-motion table slidably mounted on said base, X-screw means operably coupled to said X-motion table for moving said X-motion table in the X-direction, and X-motor means operably coupled to said X-screw means for driving said X-screw means and causing said X-motion table and said wire bonding head to move in the X-direction;
    Y-motion means operably coupled to said wire bonding head for imparting Y-directional movement to said wire bonding head, said Y-motion means including a Y-motion table slidably mounted on said X-motion table, a cantilevered sub-frame operably mounted on said Y-motion table, Y-screw means operably coupled to said Y-motion table for moving said Y-motion table in the Y-direction, and Y-motor means operably coupled to said Y-screw means for driving said Y-screw means and causing said Y-motion table and said wire bonding head to move in the Y-direction;
    theta-motion means operably coupled to said wire bonding head for imparting theta-directional rotational movement to said wire bonding head, said theta-motion means being operably mounted on said Y-motion means;
    Z-motion means operably coupled to said wire bonding head for imparting Z-directional movement to said wire bonding head, said Z-motion means being operably mounted on said Y-motion means, said Z-motion means including:
    (a) a vertical support rigidly fastened to said cantilevered sub-frame, said vertical support having a first horizontal arm at an upper end and at least one other horizontal arm, said at least one other horizontal arm having two apertures therethrough,
    (b) an alignment collar having an aperture therethrough, an alignment shaft rigidly fastened to said collar and at least one spring biasing said collar toward said first horizontal arm, said alignment shaft slidably engaging one of said apertures in said at least one other horizontal arm and a first cylindrical bore in said cantilevered sub-frame,
    (c) a cylindrical shaft slidably engaging said aperture in said alignment collar, one of said apertures in said at least one other horizontal arm, a second cylindrical bore in said cantilevered sub-frame and said theta-motion means, said cylindrical shaft having a longitudinal cylindrical bore passing therethrough and a mounting plate fastened thereto, said mounting plate being operably coupled to said wire bonding head and having a plurality of lugs slidably engaging said theta-motion means, and
    (d) Z-motor means operably coupled to said vertical support and operably engaging said alignment collar for causing said alignment collar, said alignment shaft, said cylindrical shaft and said wire bonding head to move in the Z-direction; and
    wire feed means for delivering a length of bonding wire to said wire bonding head, said wire feed means being coupled to said vertical support.

2. The apparatus for wire bonding of claim 1, wherein said theta-motion means comprises;
    a drive pulley operably engaging a belt and a flat cable, said flat cable being a multi-conductor electrical cable causing current to operate said wire bonding head;
    a driven pulley operably engaging said belt and said flat cable, said driven pulley being rotated by said drive pulley, said driven pulley having a cylindrical bore therethrough for slidably engaging said cylindrical shaft and apertures partially therethrough for slidably engaging said plurality of lugs extending from said mounting plate; and
    theta-motor means operably coupled to said drive pulley for driving said drive pulley and said driven pulley and for causing said wire bonding head to rotate.

3. The apparatus for wire bonding of claim 2, wherein said wire feed means comprises wire spool means for feeding said bonding wire down said longitudinal cylindrical bore in said cylindrical shaft to said wire bonding head.

4. The apparatus for wire bonding of claim 3, wherein said Z-motion means further comprises a cam fastened to said Z-motor means and a cam follower fastened to said alignment collar, said cam follower being operably engaged by said cam in order to move said alignment collar in the Z-direction.

* * * * *